United States Patent [19]

Wilson et al.

[11] 4,258,508
[45] Mar. 31, 1981

[54] FREE HOLD DOWN OF WAFERS FOR MATERIAL REMOVAL

[75] Inventors: Wallace Wilson, Wilkes-Barre; Frank J. Egenski, Plymouth, both of Pa.

[73] Assignee: RCA Corporation, New York, N.Y.

[21] Appl. No.: 72,430

[22] Filed: Sep. 4, 1979

[51] Int. Cl.³ .............................................. B24B 1/00
[52] U.S. Cl. .................................... 51/283 R; 51/323; 51/281 SF; 29/559
[58] Field of Search ............. 51/131.3, 131.4, 216 LP, 51/277, 281 SF, 283 R, 323; 29/559

[56] References Cited

U.S. PATENT DOCUMENTS

| | | | |
|---|---|---|---|
| 3,449,870 | 6/1969 | Jensen | 51/131.4 X |
| 3,841,031 | 10/1974 | Walsh | 51/131.4 X |
| 3,857,123 | 12/1974 | Walsh | 51/131.4 |
| 4,081,928 | 4/1978 | Kinnebrew | 51/131.4 |
| 4,129,457 | 12/1978 | Basi | 51/323 |
| 4,132,037 | 1/1979 | Bonora | 51/131.4 |

OTHER PUBLICATIONS

Meek et al., J. Electrochem. Soc., "Silicon Surface Contamination: Polishing and Cleaning," vol. 120, No. 9, Sep. 1973, pp. 1241–1246.

Primary Examiner—Gary L. Smith
Attorney, Agent, or Firm—Birgit E. Morris; Donald S. Cohen; Robert Ochis

[57] ABSTRACT

Wafers have material removed from them in processes such as lapping or polishing without the use of hold down adhesives to secure the wafers to a wafer mounting plate. The front side of a polymeric mounting pad on a wafer mounting plate is moistened with a liquid, the wafers are rendered shedding of that liquid and substantially free of adhesion diminishing particles and powder and are mounted on the moistened mounting pad. It is critical that the wafers shed the liquid with which the pad is moistened. The wafers are pressed firmly against the mounting pad in order to assure their continued adhesion to the pad during the material removal process. The wafer mounting plate is then mounted in the lapping, polishing or other material removal machine and the wafers lapped or polished in a normal manner. After completion of the desired material removal the wafers may be removed from the mounting pad with tweezers or by floating the wafers off the mounting pad. The entire process is preferably performed at room temperature.

13 Claims, 3 Drawing Figures

FREE HOLD DOWN OF WAFERS FOR MATERIAL REMOVAL

BACKGROUND OF THE INVENTION

1. Field of the Invention

The invention relates to the field of removal of material from wafers and more particularly to free hold down systems for wafers during such processing.

2. Prior Art

The prior art uses solidified wax to retain the wafers to be lapped or polished in position on a wafer mounting plate. Following completion of the lapping or polishing, the wafers are removed from the mounting plate by chilling the mounting plate, the wafers and the wax to render the wax brittle and then applying a small mechanical shock or force to the wafer to fracture the wax and release the wafer from the mounting plate. The wafers are then cleaned in a sequence of solutions to remove residual wax and other materials which are detrimental to the intended use of the wafer. This process is relatively expensive, first because of the cost of the wax, second because of excessive breakage of wafers during the removal and cleaning processes and third because of the cost of the removal and cleanup steps.

Because of the drawbacks of the waxed-down wafer mounting process, it has been an objective in the wafer processing industries to develop the ability to free mount wafers without the use of adhesive materials.

U.S. Pat. Nos. 3,841,031 and 3,857,123, both to Walsh, disclose a free polishing system for wafers using single-wafer chucks and dynamic loading of the chucks. These patents disclose the use of a poromeric material as the wafer mounting surface of a wafer chuck. A material such as that sold by Dupont under the tradename "Corfam" is used. The smooth or front surface of the poromeric material contacts the wafer. The wafers are mounted by moistening the pad with water and placing the wafers on the pad. No particular wafer characteristics or wafer preparation procedures are specified in these patents as being required for proper operation of the system. These patents assert that their process is useful for all types of wafers, including semiconductor materials, refractory oxides and magnetic bubble materials. So far as the present inventors are aware, the technique of these patents has not become a commercial success.

U.S. Pat. No. 4,132,037 to Bonora discloses a method of adhering a plurality of wafers to be polished to a polymeric pad mounted on a wafer mounting plate. The adhesion is obtained in a liquid free manner via direct solid-to-solid wetting characteristics at the exposed surface of the pad with the material of the wafer. Like Walsh, Bonora specifies no particular wafer characteristics or wafer preparation procedures for use on the wafers prior to mounting on the pad. Bonora teaches use of a heat press station at 125° F. (52° C) for a period of one minute at a pressure of about 1 PSI in order to seat the wafers. In order to remove the wafers from the mounting pad, Bonora teaches cooling the wafers and mounting material to 2° C. after which a thin bladed tool is inserted under each wafer to break the bond. Bonora indicates that his technique is suitable for wafers 15–25 mils thick.

A simplified, room temperature free mounting technique is needed which is effective for multiple wafers mounted on a single wafer mounting plate and with wafers less than 15 mils thick.

SUMMARY OF THE INVENTION

In accordance with the invention, wafers are preferably processed using wafer mounting plates each of which hold a plurality of wafers. A wafer mounting pad of a poromeric material is bonded to each wafer mounting plate with the smooth or front surface outward. Wafers are free mounted on the pad without adhesives. To mount the wafers, the mounting pad is moistened with a liquid, excessive liquid is removed from the surface of the pad and the wafers are placed on the mounting pad surface and pressed in place. It is critical to this process that the wafer surface in contact with the mounting pad (1) shed the liquid with which the pad is moistened and (2) be sufficiently free of adhesion diminishing particulate matter that particles do not weaken the adhesion between the wafers and the pad to the point where wafers shift and come loose during processing. The rotatable table of the material removal machine must also be hard enough that the wafers are not pushed far enough into the table that excessive friction is created. The wafer mounting plate is then mounted upon the material removal machine and the processing carried out in a normal manner. Following the completion of the processing, the wafers may be easily removed from the mounting plate using tweezers or floated from the plate. The entire process from mounting through wafer removal is preferably performed at room temperature.

When the mounting pad is moistened with water, the wafers must be rendered hydrophobic and thus water shedding. Where the wafers are silicon, they may usually be rendered hydrophobic by immersion in hydrofluoric acid which will remove any oxides of silicon on their surfaces.

DETAILED DESCRIPTION OF THE PREFERRED EMBODIMENT

Figure 1:
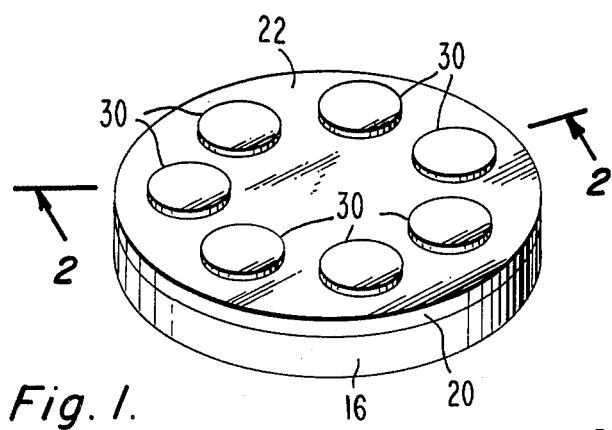
FIG. 1 illustrates the manner of placing wafers on the wafer mounting plate.
Figure 2:
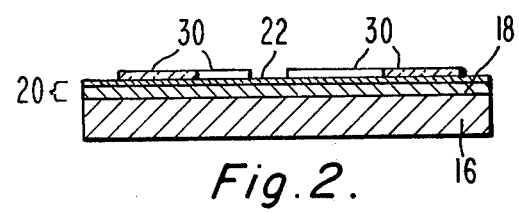
FIG. 2 is a cross section taken along line 2—2 of FIG. 1.
Figure 3:
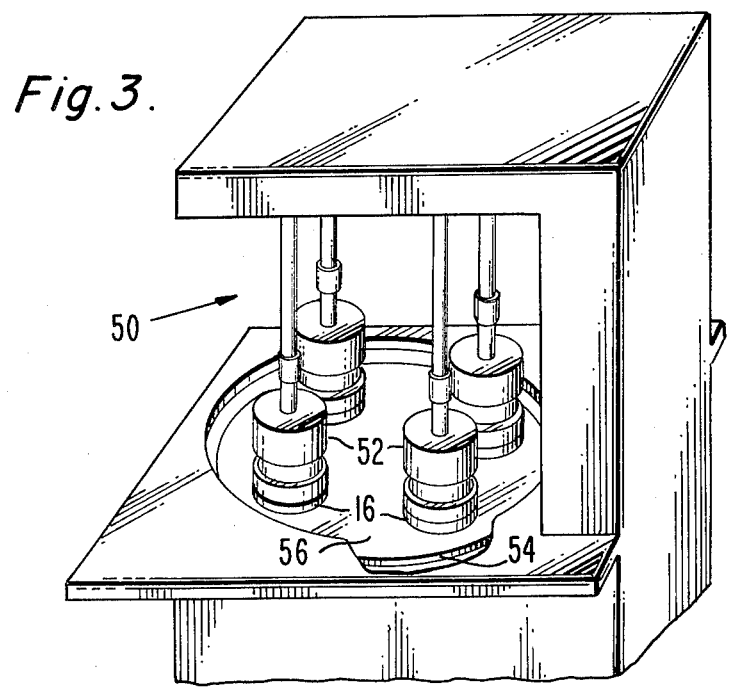
FIG. 3 is a perspective illustration of a type of wafer polishing machine with which this invention is particularly successful.

In accordance with the preferred embodiment of this invention, a poromeric material 20 is mounted on the wafer receiving surface 18 of a wafer mounting plate 16 as illustrated in FIG. 1. For mounting on a Tizon-Tech Mark I or Mark II wafer polishing machine, the wafer mounting plate 16 is approximately 10½ inches (~26.7 cm) in diameter. Such a system is known as a low pressure, static loaded wafer polishing system. A polishing machine of this type is illustrated generally at 50 in FIG. 3. A wafer mounting plate for such a machine is capable of holding eight 3 inch (7.62 cm) diameter wafers. We have found that the best results are obtained in accordance with this invention when seven wafers 30 are mounted on the plate with the center portion of the plate left vacant as illustrated in FIG. 1.

The preferred poromeric material is that sold by the George Newman Company of Biddleford, Maine, under the tradename FP-5G. This material has a total thickness of approximately 65 mils (~1.65 mm). This poromeric material 20 is mounted with its smooth or front face 22 outward for receiving wafers to be polished. Prior to mounting of the wafers on the wafer mounting plate, the surface of the poromeric material is cleaned to assure the substantial absence of harmful particulate material. The poromeric material is then wetted with a liquid, which is preferably water, and the excess liquid is removed. When the wetting liquid is water, the excess may be removed by wiping the surface of the pad with a disposable paper towel.

Also prior to mounting the wafers on the mounting plate, the wafers are cleaned so as to be substantially free of adhesion diminishing loose particulates and powders and are rendered shedding of the liquid used to moisten the mounting pad. We have found that for operation with our polishing machines, it is critical that the wafer surface in contact with the poromeric material be shedding to the liquid which moistens the mounting pad. If the liquid is water, as is preferred, then the wafers are rendered hydrophobic so as to be water shedding. When wafers are as clean as specified and hydrophobic, either no wafers change position on the mounting plate 16 during polishing or only very slight wafer movement takes place and no wafers come loose.

If the wafers are not rendered hydrophobic, then the wafers tend to shift position on the wafer mounting plate during polishing and will sometimes slip off the plate and crack-up thereby destroying many or all of the wafers being polished during that run. Such crackups have also been known to score the polishing surface of the wafer polishing machine. For this reason, it is critical that the wafers be both shedding to the moistening liquid and sufficiently free of loose materials that detrimental wafer position shifts on the plate during polishing are avoided.

The wafers are cleaned to remove loose powder and particles from the surface of the wafer which will contact the pad. This has at least two purposes. First, it aids in the adhesion of the wafer to the pad and second, it also aids in the preventing of dimpling of the wafers. Wafers become dimpled during lapping or especially polishing when particles are trapped between the mounting plate and the wafer. This has always been a particular problem with the prior art waxdown processes. These particles cause localized increases in the polishing pressure as well as slight deflection of the wafer during polishing. These two affects combine to cause a greater removal of material from the wafer in those areas where there is a particle trapped between the wafer and the mounting plate. This increased material removal results in the formation of a depression in the surface of the polished wafer following its removal from the mounting plate. In the present process, the resilience of the mounting pad 20 minimizes or eliminates the dimple-inducing effect of extremely small particles. However, large particles still cause dimples and all particles and powders tend to reduce the adhesion between the mounting pad and the wafer.

The technique of this invention is particularly effective with silicon wafers for use in the fabrication of semiconductor devices. Such wafers are monocrystalline and non-porous and thus easily chemically treated without the wafer absorbing the treated fluid. As discussed above, the wafers are cleaned to remove particles and powder from the surface of the wafer. Any of the well-known silicon wafer cleaning techniques used in the semiconductor industry may be used to remove particles, powder and dust from the wafers. We have used a cotton swab test to determine whether wafers are sufficiently free of particles, powder and dust. In this test, a cotton swab is dipped in methylene chloride and scrubbed back and forth across the wafer surface. If the swab remains clean and white, then the wafer is considered sufficiently clean. If the swab is no longer clean and white, then the wafer is recleaned to remove any particles, powder or dust.

As a final cleaning step, silicon wafers are preferably treated with hydrofluoric acid to remove any remaining or newly formed silicon oxide from the surface of the wafer which will contact the mounting pad. Elemental silicon, whether doped or undoped, is hydrophobic, thus a bare silicon surface in contact with the mounting pad is preferred. Silicon oxide is not hydrophobic and therefore in accordance with this invention must be removed from the surface of the silicon wafer which contacts the mounting pad prior to the mounting of the wafer on the pad.

Our wafer polishing machines are static loaded with a weight of approximately 200 pounds per head 52 bearing on the wafer mounting plate 16 thereunder. This weight is not easily changed. With five wafers mounted on a wafer plate, this weight provides a force of approximately 5.66 pounds per square inch of wafer area. Six wafers per wafer plate yield a force of approximately 4.71 pounds per square inch of wafer area and seven wafers per plate yield a force of approximately 4.04 pounds per square inch of wafer area. This technique has been successfully used with five, six or seven wafers per polishing plate. Thus, a polishing force in the range from about 4 to about 5.7 pounds per square inch is acceptable. Higher polishing pressures can be used if desired, however, where the only way to increase the pressure is by reducing the number of wafers being polished, this is not attractive. However, increasing the polishing pressure has the advantage of increasing the friction which holds the wafer in place on the mounting plate. Consequently, if wafer shifting on the mounting plate becomes a problem, increasing the polishing pressure can aid in correcting it.

In mounting the wafers on the wafer mounting plate, seven wafers 30 are preferably distributed about the periphery of the plate 16. The center of the plate is left vacant. Our results indicate that the absence of a wafer in the center of the plate is necessary to prevent undesirable wafer shifting and crack-ups. This appears to be either a motion related problem or a problem of the system being unable to apply an appropriate pressure to all the wafers when one is in the center of the wafer mounting plate. This technique is more easily implemented with six wafers on the plate rather than seven. This is because six wafers result in higher polishing pressures and increased space between wafers. The increased space allows larger wafer shifts without detrimental effects. However, we have found that if substantial care is used in mounting the wafers, this technique will work equally well with seven wafers per wafer mounting plate. Seven wafers (rather than size) per plate provides a throughput increase of about 16% when no change in percentage yield results from the increased number of wafers.

In the event of wafers shifting on the mounting plate during polishing, the hydrophobicness of the wafer surface in contact with the plate should be checked. If that surface is not hydrophobic, the wafers adhesion to the mounting plate is reduced. Even small areas which are not hydrophobic can have substantial adverse effects on wafer adhesion.

When a silicon wafer to be polished has been cleaned and rendered hydrophobic, but is otherwise in as-sawn condition, this process will remove about 1.2 mils (approximately 0.03 mm) from the wafer during a 70 minute polishing cycle using our polishing vehicle. Our polishing vehicle comprises 15 pounds of a silica polishing agent sold by Philadelphia Quartz under the tradename G-32 mixed in 100 gallons of water. This mixture is adjusted to have a PH of 8.5 to 9.0 by adding the organic base quaternary amonium hydroxide. When formulated in this manner, this polishing vehicle comprises approximately 2 percent solids in water.

In accordance with this preferred embodiment, the wafer mounting plates are cleaned, the surface of the mounting pads are moistened with water, excess water is removed and seven hydrophobic wafers are placed on the plate. In order to prevent wafer slip during polishing, all the wafers mounted on a single plate should have a similar thickness. To this end, we prefer to limit the maximum difference in thickness between the thinnest and the thickest wafer to no more than 0.5 mil (approximately 0.013 mm). Three or four such plates are prepared at a time, depending on whether a three head polishing machine or a four head polishing machine is being utilized. With the first wafer mounting plate positioned wafer-side-up, a thick absorbent towel or sponge approximately ½ inch thick is placed over the first plate and the wafers thereon. The second plate is turned wafer-side-down and placed on top of the absorbent towel or sponge which has already been placed over the first plate. The third plate is placed wafer-side-up on top of this stack. A second absorbent towel or sponge is placed over the third plate and the wafers thereon. If four plates are being prepared, the fourth plate is placed wafer-side-down on top of the towel or sponge over the third plate. The resulting three or four plate stack is placed in a pneumatic press which preferably applies a pressure of more than 10 pounds per square inch of wafer surface. A pneumatic cylinder having a 4 inch (10.16 cm) bore with an applied pressure of 55 psi, gauge is preferred for applying pressure to the plate of the press. This yields a pressure of about 13.9 pounds per square inch of wafer surface when seven wafers are mounted per plate. This pressure need only be maintained as long as is necessary to properly seat the wafers. However, it is preferred to maintain this pressure for about two or more minutes to assure that the wafers are firmly seated on the mounting pad. This pressing operation is preferably done at room temperature. Following the release of the pressure, the wafer mounting plates are ready for removal from the press and for mounting on the wafer polishing machine.

The press is utilized because mere placement of the wafers on the mounting pad was found to be insufficient to assure the retention of the wafer on the pad throughout the polishing process. Hand pressure was considered too erratic, generally insufficient and too likely to accidently fracture wafers.

The prepared wafer mounting plates are preferably loaded onto the ratatable table 54 of a wafer polishing machine whose polishing pad 56 is moist (neither dry nor flooded with water). The flow of the polishing vehicle is then turned on, after which the machine is started. A hard polishing pad is needed to assure that the wafers do not sink into the surface of the polishing pad far enough that sufficient friction is created to dislodge the wafers from the mounting pad. A Rodel SUBA IV polishing pad is preferred. This is a hard polyurethane material unpregnated with polyester felt.

The polishing process proceeds in the normal manner until the wafers have been polished to the desired degree. Thereafter, the machine is shut off and the wafer mounting plates are removed from the polishing machine and placed wafer side up in a sink. The wafers are then removed from the mounting plate under running deionized water by lifting the wafers gently with tweezers. Removal of the wafers under running water prevents any material from drying on the wafers and becoming more difficult to remove. The running water also seems to aid in releasing the wafer from the pad. Wafer removal is preferably performed at room temperature.

Many different thicknesses of 3 inch diameter silicon wafers have been routinely polished using this process with excellent yield. Wafers up to 40 mils (~1.02 mm) thick have been polished. Thicker wafers may be polished if desired. Wafers having a 3 inch diameter and a finished thickness as thin as 6 mils (~0.15 mm) have been polished on both sides using this technique. These thicknesses compare with the semiconductor industry's normal ability to polish 3 inch wafers down to only about 15 mils (~0.38 mm) if excessive breakage is to be avoided.

Using this process, 9-11 mil (~0.23 to ~0.28 mm) wafers are routinely polished in a factory environment with polishing yields of 85 percent to 90 percent. Using the prior art wax-down process, yields were 70 percent to 75 percent for the same wafer thicknesses. In each case, some of the yield loss was due to scratches, chips and incomplete polishing of individual wafers. This free polishing process produces very few (almost zero) dimpled wafers and few broken ones. The prior art process produced more dimpled wafers and many more broken ones, most of which broke during demounting. The free polish process reduces the incidence of dimples by enabling improved control over the presence of dirt or other particulate matter between the mounting plate and the wafer as well as by providing some cushioning via the mounting pad.

The entire process, including mounting and demounting of wafers is preferably carried out without heating or refrigerating any of the wafers or wafer mounting materials. This minimizes costs, complexities, equipment requirements and safety hazards. This mounting process has also been found useful for mounting monocrystalline sapphire wafers for lapping at pressures of about 3 pounds per square inch of wafer surface. The lapping table has no slurry retaining nab as is usually present on the table of a polishing machine. The low pressure (~3 psi) is needed in order that the lapping slurry will not be squeezed from underneath the wafer during lapping.

This invention provides at least the following benefits over prior art processes. First, better wafer adherence to a moistened mounting pad is obtained with a liquid shedding wafer than is obtained with one which is not liquid shedding. Second, this is a free polishing process which works in a factory environment on wafer polishing machines each having a plurality of wafer mounting plates each designed for mounting a plurality of wafers per plate. Third, the quantity of breakage is reduced because of the free polish nature of the process and because although the adhesion of the wafer to the mounting plate is sufficient for polishing, it is still weak enough that even very thin (fragile) wafers (about 6 mils thick) can be removed without significant breakage. Fifth, the entire operation is done at room temperature.

Crack-ups and other destructive movements of wafers are prevented so long as the wafers being polished are liquid shedding and substantially free of adhesion diminishing particles.

An improved method of free hold down of wafers for material removal has been shown and described. Those skilled in the art will be able to vary the preferred embodiment without departing from the scope of this invention as defined in the appended claims.

What is claimed is:

1. In the method of polishing wafers comprising mounting wafers on a moistened poromeric pad for retention during free polishing of the wafer, the improvement comprising:
   cleaning the side of the wafer which is to contact said mounting pad so that said side is shedding to the liquid with which the pad is moistened and substantially free of adhesion diminishing particles prior to placing said wafer on said mounting pad.

2. The improvement recited in claim 1 wherein a plurality of wafers are mounted on each wafer mounting pad.

3. The improvement recited in claim 1 further comprising the steps of:
   cleaning said pad;
   wetting said pad with water; and
   removing the excess water prior to placing the wafers on the mounting pad.

4. The method recited in claim 3 further comprising the steps of:
   placing the wafers with a hydrophobic surface thereof in contact with the mounting pad; and
   applying pressure to the wafers substantially uniformly to set them in place.

5. The method recited in claim 4 wherein said applying pressure step comprises applying a force in excess of 10 pounds per square inch of wafer surface for a period of about two minutes.

6. The method recited in claim 4 further comprising the steps of:
   placing the wafer mounting plate wafer side down on a wafer polishing machine; and
   polishing said wafers until they reach a desired condition.

7. The method recited in claim 6 further comprising:
   lifting the wafers off said pad after said wafers have been polished to a desired extent.

8. A method of removing material from wafers comprising:
   preparing a wafer mounting plate having a poromeric pad thereon by:
      cleaning said pad; and
      moistening said pad with a predetermined liquid;
   cleaning each wafer at least on the side which is to contact said mounting pad to assure that it is substantially free of adhesion diminishing particles and is shedding to said preselected liquid;
   mounting a plurality of such wafers on said mounting pad of said mounting plate;
   placing said wafer mounting plate with said mounted wafers on a material removal machine for removal of material from said wafers by relative motion between said wafers and the table of said removal machine against which they are supported; and
   running said machine for a period of time sufficient to remove the desired quantity of material.

9. The method recited in claim 8 wherein said wafers are pressed against said table with a pressure of less than 10 pounds per square inch of wafer surface during said material removal process.

10. The method recited in claim 9 wherein said pressure is less than 5.7 pounds per square inch.

11. The method recited in claim 8 wherein said wafers are non-porous.

12. The method recited in claim 8 wherein said material removal is for the purpose of polishing the wafer.

13. The method recited in claim 8 wherein the material removal is for the purpose of lapping the wafer.

* * * * *

UNITED STATES PATENT AND TRADEMARK OFFICE
CERTIFICATE OF CORRECTION

PATENT NO. : 4,258,508

DATED : March 31, 1981

INVENTOR(S): Wallace Wilson et al.

It is certified that error appears in the above-identified patent and that said Letters Patent is hereby corrected as shown below:

Column 4, line 60: "size" should be --six--

Column 5, line 29: "1/2" should be --1/8-- line 62: "ratatable" should be --rotatable--

Signed and Sealed this

Sixteenth Day of June 1981

[SEAL]

Attest:

RENE D. TEGTMEYER

Attesting Officer     Acting Commissioner of Patents and Trademarks